(12) United States Patent
Zhu

(10) Patent No.: US 10,910,410 B2
(45) Date of Patent: Feb. 2, 2021

(54) FLEXIBLE ARRAY SUBSTRATE, FLEXIBLE DISPLAY DEVICE AND METHOD OF ASSEMBLING THE SAME

(71) Applicants: CHENGDU BOE OPTOELECTRONICS TECHNOLOGY CO., LTD., Sichuan (CN); BOE TECHNOLOGY GROUP CO., LTD., Beijing (CN)

(72) Inventor: Xiaolong Zhu, Beijing (CN)

(73) Assignees: CHENGDU BOE OPTOELECTRONICS TECHNOLOGY CO., LTD., Sichuan (CN); BOE TECHNOLOGY GROUP CO., LTD, Beijing (CN)

(*) Notice: Subject to any disclaimer, the term of this patent is extended or adjusted under 35 U.S.C. 154(b) by 16 days.

(21) Appl. No.: 16/262,240

(22) Filed: Jan. 30, 2019

(65) Prior Publication Data
US 2019/0244976 A1 Aug. 8, 2019

(30) Foreign Application Priority Data
Feb. 2, 2018 (CN) .......................... 2018 1 0109223

(51) Int. Cl.
*H01L 27/00* (2006.01)
*H01L 27/12* (2006.01)
*H01L 51/56* (2006.01)
*H01L 27/32* (2006.01)
*H01L 51/00* (2006.01)

(52) U.S. Cl.
CPC ........ *H01L 27/124* (2013.01); *H01L 27/1218* (2013.01); *H01L 27/3288* (2013.01); *H01L 51/56* (2013.01); *H01L 27/3276* (2013.01); *H01L 51/0097* (2013.01); *H01L 2251/5338* (2013.01)

(58) Field of Classification Search
None
See application file for complete search history.

(56) References Cited

U.S. PATENT DOCUMENTS

| 2005/0068486 | A1* | 3/2005 | Ono ................ G02F 1/13452 349/150 |
| 2013/0120328 | A1* | 5/2013 | Lee ................ G02F 1/1345 345/206 |
| 2017/0033123 | A1* | 2/2017 | Lv .................. H01L 27/1259 |
| 2018/0040633 | A1* | 2/2018 | Lee .................. H01L 27/124 |

* cited by examiner

*Primary Examiner* — Reema Patel
(74) *Attorney, Agent, or Firm* — McDermott Will and Emery LLP

(57) ABSTRACT

A flexible array substrate has a main display area, and includes a flexible substrate and a plurality of signal connecting portions. The flexible substrate includes at least one bent portion extending from at least one side of the main display area. The plurality of signal connecting portions are disposed at a side of the at least one bent portion away from the main display area. A plurality of signal lines are disposed on a first surface of the flexible substrate in the main display area. The plurality of signal connecting portions are configured to electrically connect the plurality of signal lines to at least one driving circuit. The at least one bent portion is configured to bend toward a second surface of the flexible substrate opposite to the first surface.

13 Claims, 6 Drawing Sheets

C-C'

FLEXIBLE ARRAY SUBSTRATE, FLEXIBLE DISPLAY DEVICE AND METHOD OF ASSEMBLING THE SAME

CROSS-REFERENCE TO RELATED APPLICATION

This application claims priority to Chinese Patent Application No. 201810109223.X, filed on Feb. 2, 2018, titled "A FLEXIBLE ARRAY SUBSTRATE, FLEXIBLE DISPLAY DEVICE AND METHOD OF ASSEMBLING THE SAME", which is incorporated herein by reference in its entirety.

TECHNICAL FIELD

The present disclosure relates to the field of display technologies, and in particular, to a flexible array substrate, a flexible display device, and a method of assembling the same.

BACKGROUND

With the continuous development of display technologies, the demand for display devices with high screen-to-body ratio (super high screen-to-body ratio) has been increasing continuously, which makes display devices with high screen-to-body ratio become a research hotspot in recent years.

SUMMARY

In an aspect, a flexible array substrate is provided. The flexible array substrate has a main display area. The flexible array substrate includes a flexible substrate and a plurality of signal connecting portions. The flexible substrate includes at least one bent portion extending from at least one side of the main display area. The plurality of signal connecting portions are disposed at a side of the at least one bent portion away from the main display area. A plurality of signal lines are disposed on a first surface of the flexible substrate in the main display area. The plurality of signal connecting portions are configured to electrically connect the plurality of signal lines to at least one driving circuit. The at least one bent portion is configured to bend toward a second surface of the flexible substrate opposite to the first surface to move the plurality of signal connecting portions to a back side of the main display area away from the first surface.

In some embodiments, the plurality of signal lines include a plurality of gate lines and a plurality of data lines crossing each other, the plurality of signal connecting portions include a plurality of data connecting portions and/or a plurality of gate connecting portions, and the at least one driving circuit includes at least one source driving circuit and at least one gate driving circuit. The plurality of data connecting portions are configured to electrically connect the plurality of data lines to the at least one source driving circuit, and/or the plurality of gate connecting portions are configured to electrically connect the plurality of gate lines to the at least one gate driving circuit.

In some embodiments, the flexible array substrate further includes a plurality of data line leads and/or a plurality of gate line leads disposed on the first surface of the flexible substrate. The plurality of data connecting portions are configured to respectively electrically connected to the plurality of data lines through the plurality of data line leads, and/or the plurality of gate connecting portions are configured to respectively electrically connected to the plurality of gate lines through the plurality of gate line leads.

In some embodiments, the main display area is polygonal in shape, the at least one bent portion includes two bent portions which respectively extend from a pair of opposite sides of the main display area, and the plurality of signal connecting portions are located at the pair of opposite sides of the main display area.

In some embodiments, the main display area is polygonal in shape, the plurality of gate connecting portions and the plurality of data connecting portions are located at at least one of a pair of opposite sides of the main display area, and extension lines of the plurality of gate lines pass through the main display area and extend to the at least one bent portion.

In some embodiments, each of the plurality of data line leads includes a lead body located in the main display area, and/or an edge lead located between the main display area and the plurality of data connecting portions. One end of the lead body is connected to a corresponding one of the plurality of data lines in the main display area, and another end of the lead body is connected to a corresponding one of the plurality of data connecting portions through the edge lead.

In some embodiments, the main display area is substantially rectangular, and the main display area has a pair of opposite long sides and a pair of opposite short sides. The flexible array substrate includes a pair of opposite long edges and a pair of opposite short edges. The at least one bent portion is located on at least one of the pair of opposite long edges of the flexible array substrate, and the flexible array substrate is not provided with a bent portion on the pair of opposite short edges.

In some embodiments, a portion of the flexible substrate within the main display area includes a main portion and at least one curved portion each between the main portion and a corresponding one of the at least one bent portion.

In some embodiments, the at least one bent portion and the at least one curved portion are configured to be bent, and the main portion is flat. A boundary away from the main portion in boundaries of an orthographic projection of each of the at least one bent portion in a plane parallel to the main portion is a first boundary, and a boundary away from the main portion in boundaries of an orthographic projection of a corresponding one of the at least one curved portion on a plane parallel to the main portion is a second boundary. The first boundary and the second boundary are located outside the main portion and located at a same side of the main portion. The first boundary and the second boundary overlap substantially.

In another aspect, a flexible display device is provided. The flexible display device includes the flexible array substrate described above, and at least one driving circuit electrically connected to the plurality of signal connecting portions in the flexible array substrate.

In some embodiments, the plurality of signal connecting portions comprise a plurality of data connecting portions and/or a plurality of gate connecting portions, and the at least one driving circuit includes at least one source driving circuit and at least one gate driving circuit. The at least one source driving circuit is electrically connected to the plurality of data connecting portions in the flexible array substrate, and/or the at least one gate driving circuit is electrically connected to the plurality of gate connecting portions in the flexible array substrate.

In some embodiments, the at least one driving circuit is at least one GOA circuit. Output end(s) of the at least one GOA circuit are electrically connected to the plurality of gate connecting portions.

In some embodiments, the at least one source driving circuit is at least one source driver IC, and the at least one source driver IC and the plurality of data connecting portions are connected by at least one COF.

In yet another aspect, a method of assembling a flexible display device is provided. The method includes: providing the flexible array substrate described above, the flexible array substrate including at least one GOA circuit; mounting components including at least one source driver IC on the flexible array substrate described above, and bending the flexible array substrate along the at least one bent portion to obtain a bent flexible array substrate, so as to move the at least one source driver IC and the at least one GOA circuit to a back side of a portion of the flexible array substrate corresponding to the main display area; and bonding the bent flexible array substrate and a cover plate with an optically clear adhesive, so as to assemble a flexible display device.

In some embodiments, a portion of the flexible substrate within the main display area includes a main portion and at least one curved portion each located between the main portion and a corresponding one of the at least one bent portion. Bending the flexible array substrate along the at least one bent portion to obtain a bent flexible array substrate, so as to bend the at least one source driver IC and the at least one GOA circuit to a back side of a portion of the flexible array substrate corresponding to a main display area, includes: bending the flexible array substrate along the at least one bent portion to obtain a bent flexible array substrate, so as to bend the at least one source driver IC and the at least one GOA circuit to a back side of a portion of the flexible array substrate corresponding to the main portion by way of the at least one curved portion and the at least one bent portion.

BRIEF DESCRIPTION OF THE DRAWINGS

In order to describe technical solutions in embodiments of the present disclosure more clearly, the accompanying drawings used in the description of embodiments will be introduced briefly. Obviously, the accompanying drawings to be described below are merely some embodiments of the present disclosure, and a person of ordinary skill in the art can obtain other drawings according to these drawings without paying any creative effort.

DETAILED DESCRIPTION

The technical solutions in embodiments of the present disclosure will be described clearly and completely with reference to the accompanying drawings in embodiments of the present disclosure. Obviously, the described embodiments are merely some but not all of embodiments of the present disclosure. All other embodiments made on the basis of the embodiments of the present disclosure by a person of ordinary skill in the art without paying any creative effort shall be included in the protection scope of the present disclosure.

Unless otherwise specified, "a plurality of" herein refers to two or more than two. Terms "and/or" herein merely describes an association of associated objects, which include three situations. For example, "A and/or B" refers to three situations: A alone, A and B, and B alone. Terms "First" and "second" herein are to distinguish between same or similar items whose functions and roles are substantially the same. Those skilled in the art understand that "first" and "second" do not limit a number and an order of execution, nor do they limit the "first" and "second" items to be different.

Taking a mobile phone as an example, since a region of a bezel needs to be provided with driving circuits or driver ICs (integrated circuits), and wirings therein, a width of the bezel needs to be large. In recent years, flexible display screens have emerged. By bending bent portions of a back plate, which are respectively disposed on edges of the back plate, of the flexible display screen, components such as the driver ICs in the mobile phone are moved to a back side of the display screen, thus significantly reducing the width of the bezel.

However, due to limitations of the actual process, it is not possible to bend all edges of the display screen by bending the bent portions. Generally, long edges of the mobile phone is bent by bending the bent portions on the long edges, so that the width of the bezel along the long edge is narrow. For short edges of the bezel which cannot be bent, since source driving ICs need to be disposed on the short edges, widths of the bezel at the short edges are large.

Figure 1:
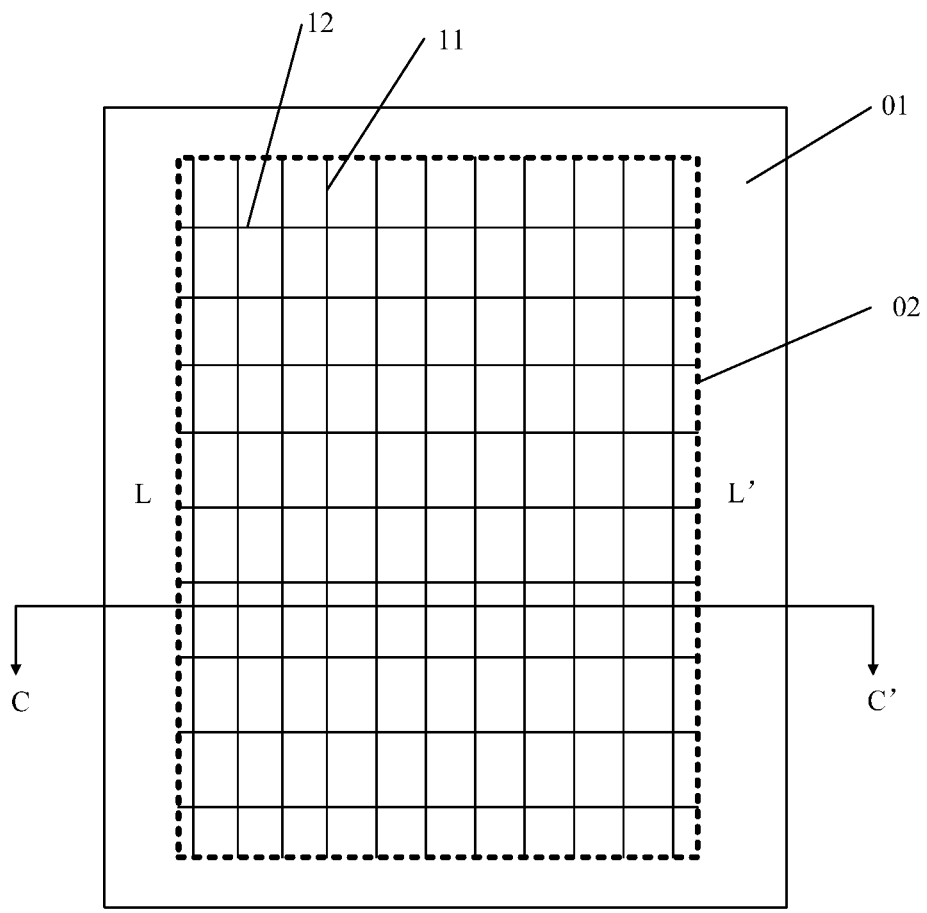
FIG. 1 is a schematic diagram showing a structure of a flexible array substrate according to some embodiments of the present disclosure.
Figure 2:
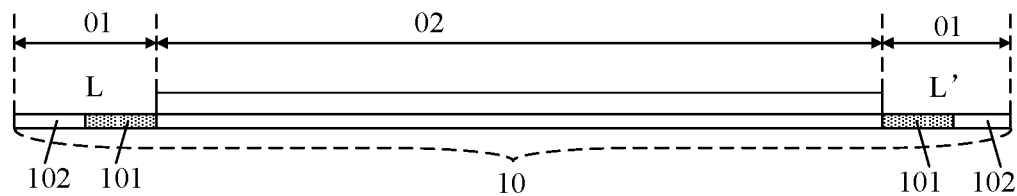
FIG. 2 is a cross-sectional view taken along line C-C' of FIG. 1.

With regard to the above problems, some embodiments of the present disclosure provide a flexible array substrate, and as shown in FIGS. 1 and 2 (FIG. 2 is a cross-sectional view taken along line C-C' of FIG. 1), the flexible array substrate has a main display area 02. As shown in FIG. 2, the flexible array substrate includes a flexible substrate 10 which includes at least one bent portion 101, and the at least one bent portion 101 extends from at least one side of the main display area 02. For example, as shown in FIG. 2, two bent portion 101 respectively extend from L side and L' side of the main display area 02 in directions away from the main display area 02. As shown in FIGS. 1 and 2, the flexible array substrate also has a non-display area 01 surrounding the main display area 02, and the at least one bent portion 101 is located in the non-display area 01.

The flexible substrate 10 is formed of a flexible bendable material, for example, polyimide (PI). In some embodiments, the flexible substrate 10 includes an upper PI layer, a lower PI layer and an inorganic thin film layer therebetween. In some other embodiments, the flexible substrate 10 includes a single PI layer or multiple PI layers.

Figure 3:
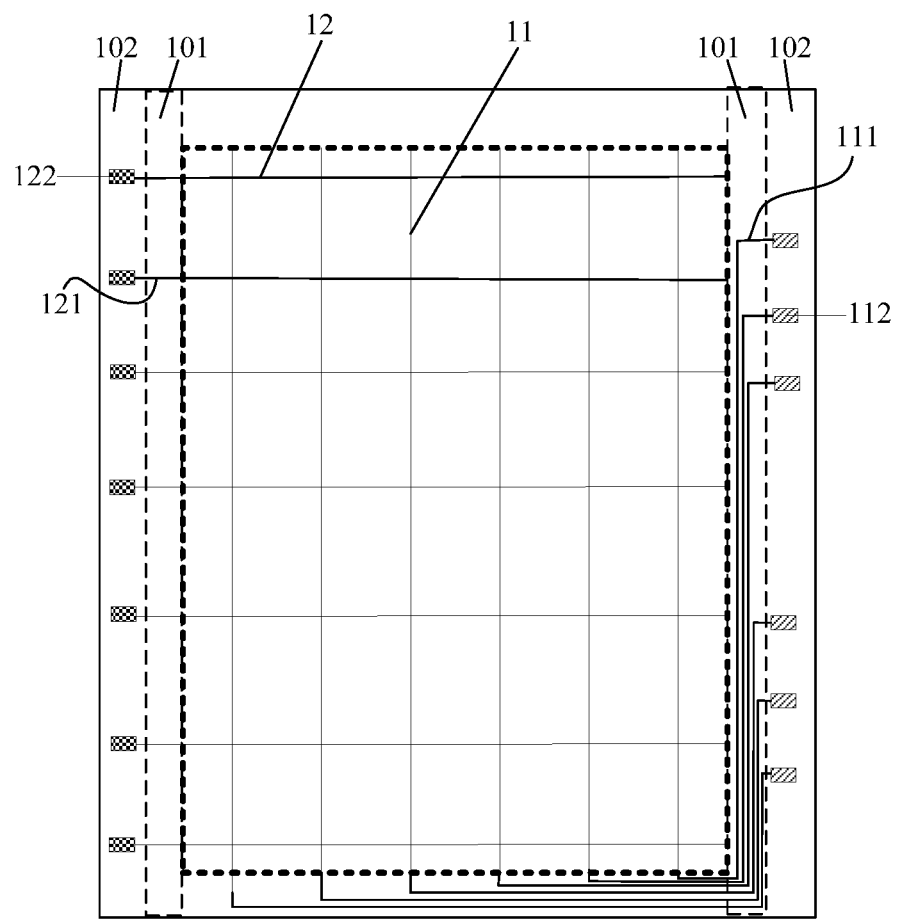
FIG. 3 is a schematic diagram showing a structure of another flexible array substrate according to some embodiments of the present disclosure.

As shown in FIG. 3, the flexible array substrate further includes a plurality of signal connecting portions (e.g., 112 and/or 122) disposed at a side of the at least one bent portion 101 away from the main display area 02. That is, each of the plurality of signal connecting portions is located at a side of a corresponding one of the at least one bent portion 101 away from the main display area 02. The plurality of signal connecting portions are disposed on a first surface of the flexible substrate 10 in the non-display area 01.

In addition, as shown in FIG. 3, a plurality of signal lines (e.g., 11 and 12) are disposed on the first surface of the flexible substrate 10 in the main display area 02. The plurality of signal connecting portions are configured to electrically connect the plurality of signal lines to at least one driving circuit, and the at least one bent portion is configured to bend toward a second surface of the flexible substrate opposite to the first surface to move the plurality of signal connecting portions to a back side of the main display area 02 away from the first surface.

As shown in FIGS. 2 and 3, a region where each of the at least one bent portion 101 is located is a bending region (also referred to as a bending area), and a region of the flexible array substrate located at a side of the bending region away from the main display area 02 is a connecting region 102. The bending region and the connecting region 102 are included in the non-display area 01. The plurality of signal connecting portions (e.g., 122 and/or 112) are located in at least one connecting region 102.

In some embodiments, as shown in FIG. 3, the plurality of signal lines include a plurality of data lines 11 and a plurality of gate lines 12 crossing each other. In some other embodiments, the plurality of signal lines further include a plurality of control lines in addition to the plurality of data lines 11 and the plurality of gate lines 12.

It will be understood by those skilled in the art that the plurality of data lines 11 and the plurality of gate lines 12 intersect to define a plurality of sub-pixels for display herein. The area where the plurality of sub-pixels are located is the aforementioned main display area 02, which is also referred to as an Active Area, or AA. An area of the flexible array substrate located at a periphery of the main display area 02 constitutes the aforementioned non-display area 01, which is also referred to as a wiring area.

In some embodiments, the plurality of signal lines include the plurality of data lines 11 and the plurality of gate lines 12. The at least one driving circuit includes at least one source driving circuit and at least one gate driving circuit, which are configured to drive a display device to display an image. As shown in FIG. 3, the plurality of signal connecting portions include a plurality of data connecting portions 112 (also referred to as pads, bonding pins, bonding pads, etc.) and a plurality of gate connecting portions 122 (also referred to as pads, bonding pins, bonding pads, etc.). In some other embodiments, the plurality of signal connecting portions include the plurality of data connecting portions 112 or the plurality of gate connecting portions 122. The plurality of data connecting portions 112 are configured to electrically connect the plurality of data lines 11 to the at least one source driving circuit. The plurality of gate connecting portions 122 are configured to electrically connect the plurality of gate lines 12 to the at least one gate driving circuit.

Figure 4:
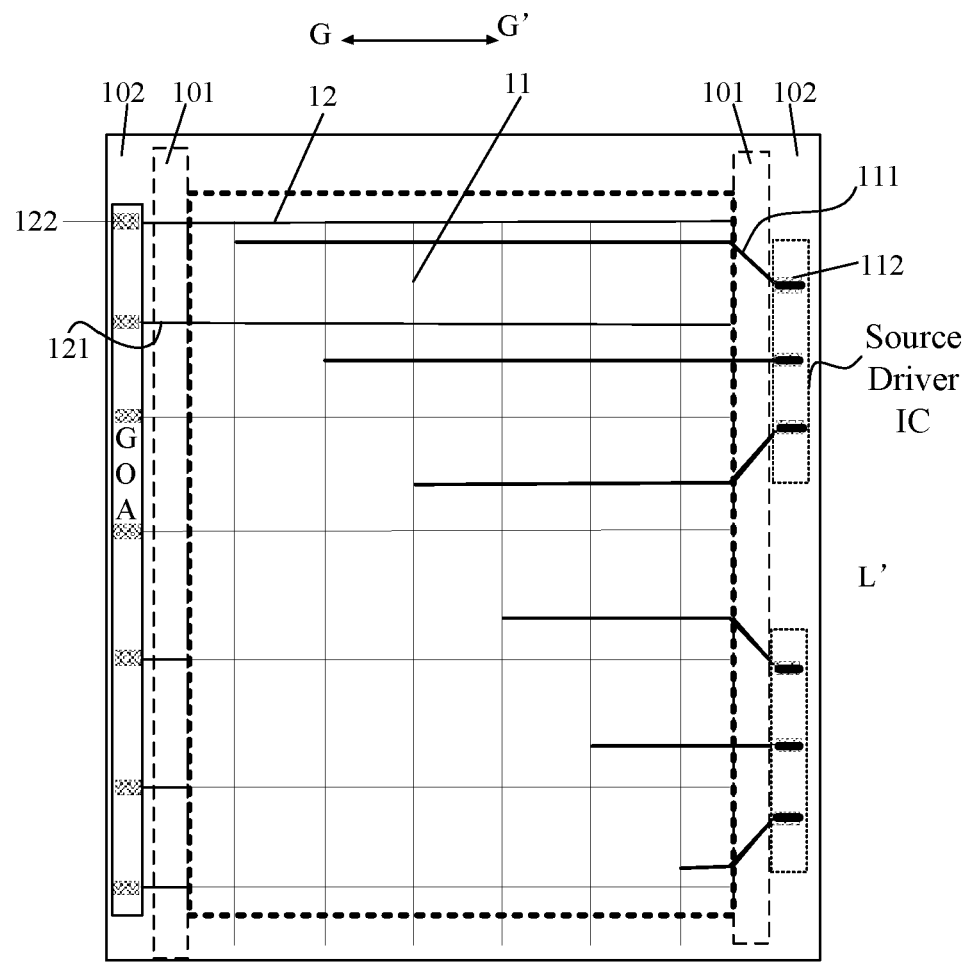
FIG. 4 is a schematic diagram showing a structure of yet another flexible array substrate according to some embodiments of the present disclosure.

As shown in FIG. 3, the plurality of gate connecting portions 122 and the plurality of data connecting portions 112 included in the signal connecting portions are located in the at least one connecting region 102. Since the at least one source driving circuit is electrically connected to the plurality of data connecting portions 112, in some embodiments, in order to facilitate wiring, the at least one source driving circuit and the plurality of data connecting portions 112 are disposed on a same side of the flexible substrate. For example, as shown in FIG. 4, the at least one source driving circuit and the plurality of data connecting portions 112 are disposed on a right side of the flexible substrate. Since the at least one gate driving circuit is electrically connected to the plurality of gate connecting portions 122, in some embodiments, in order to facilitate wiring, the at least one gate driving circuit and the plurality of gate connecting portions 122 are disposed on a same side of the flexible substrate. For example, as shown in FIG. 4, the at least one gate driving circuit and the plurality of gate connecting portions 122 are disposed on a left side of the flexible substrate.

In some embodiments, as shown in FIG. 3, the flexible array substrate further includes a plurality of data line leads 111 and a plurality of gate line leads 121 disposed on the first surface of the flexible substrate 10. In some other embodiments, the flexible array substrate further includes the plurality of data line leads 111 or the plurality of gate line leads 121 disposed on the first surface of the flexible substrate 10. The plurality of data connecting portions 112 are configured to be respectively electrically connected to the plurality of data lines 11 through the plurality of data line leads 111. The plurality of gate connecting portions 122 are configured to be respectively electrically connected to the plurality of gate lines 12 through the plurality of gate line leads 121.

Figure 12:
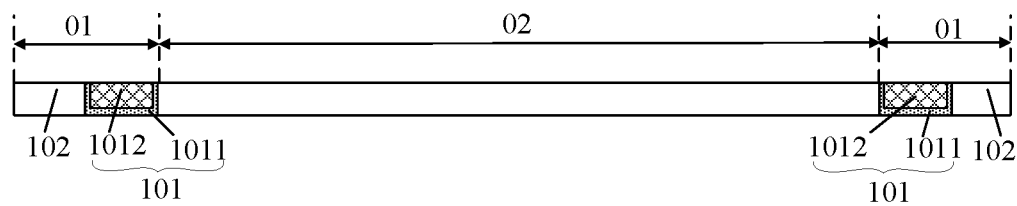
FIG. 12 is a schematic diagram showing a structure of a bent portion according to of some embodiments of the present disclosure.

In order to prevent the flexible array substrate from being broken when bent along each of the at least one bent portion 101, in some embodiments, as shown in FIG. 12, each of the at least one bent portion 101 includes at least one groove 1011 formed in a surface of the bent portion 101 close to the signal connecting portions, and at least one filler 1012 each filled in a corresponding groove 1011. The filler 1012 has a better flexibility than that of the at least one bent portion 101, to ensure that each of the at least one bent portion 101 does not break in a subsequent bending process. The material of the filler 1012 is for example a resin.

In summary, in the related art, since the at least one source driving circuit is disposed on an edge that cannot be bent (e.g., the short edge), the width of the bezel on this edge is large. In the embodiments of the present disclosure, the plurality of signal connecting portions such as the plurality of data connecting portions 112 and the plurality of gate connecting portions 122 are disposed at a side of the at least one bent portion 101 away from the main display area 02. In this way, in a case where the flexible array substrate is applied to a display device, after the at least one bent portion 101 is bent toward the second surface of the flexible substrate 10 opposite to the first surface, the plurality of signal connecting portions disposed at the side of the at least one bent portion 101 away from the main display area 02 is bent to the back side of the main display area away from the first surface. In this way, the at least one driving circuit connected to the plurality of signal connecting portions, such as the at least one source driving circuit connected to the plurality of data connecting portions 112 and the at least one gate driving circuit connected to the plurality of gate connecting portions 122, are also bent to the back side of the main display area away from the first surface. Therefore, in a case where the flexible array substrate is applied to the display device, on a basis of maintaining a narrow bezel design at at least one edge respectively provided with the at least one bent portion, it may be achieved to release space at an edge of the bezel originally provided with the at least one source driving circuit and not provided with the at least one bent portion 101, i.e., to reduce a width of the bezel at the edge.

In addition, as described above, the plurality of gate connecting portions 122 are configured to be electrically connected to the at least one gate driving circuit. In some embodiments, the at least one gate driving circuit is at least one gate driver IC (also known as at least one scan driver IC). In some other embodiments, as shown in FIG. 4, the at least one gate driving circuit is at least one GOA circuit, and the at least one GOA circuit is less expensive and takes up less space.

In some embodiments, referring to the flexible array substrate shown in FIG. 4, during a manufacturing process of the flexible array substrate, the at least one GOA circuit is fabricated in a connecting region 102 which is located at a side of a corresponding one of the at least one bent portion 101 that is away from the main display area 02 in the non-display area 01, and output end(s) of the at least one GOA circuit are configured to be directly electrically connected to the plurality of gate connecting portions 122 located at the side of the corresponding one of the at least one bent portion that is away from the main display area 02.

As described above, the plurality of data connecting portions 112 are configured to be electrically connected to the at least one source driving circuit. In some embodiments, the at least one source driving circuit is at least one source driver IC (also known as at least one data driver IC).

In some embodiments, referring to FIG. 4, regions respectively enclosed by dotted lines surrounding source driver ICs in the connecting region 102 are pre-connecting regions, and the plurality of data connecting portions 112 are disposed in the pre-connecting regions, such that the plurality of data connecting portions 112 are electrically connected to the source driver ICs in the pre-connecting regions.

Based on the above, a manner in which the at least one source driver IC and the plurality of data connecting portions 112 in the flexible array substrate are connected is not limited herein. In some embodiments, the at least one source driver IC is connected to the plurality of data connecting portions 112 by at least one COF (Chip On Film). The COF is more suitable for narrow bezel design in practice. Embodiments of the present disclosure include, but are not limited to the connection in which the at least one source driver IC is connected to a plurality of data connecting portions 112 by at least one COF. Any connection that enables the at least one source driver IC to be connected to the plurality of data connecting portions 112 is within the scope of the present disclosure.

In addition, the at least one bent portion 101 extends from which side of the main display area 02 is not limited herein. Referring to FIG. 2, in some embodiments, the main display area is polygonal in shape, the at least one bent portion 101 includes two bent portions 101 which extend from a pair of opposite sides (e.g., L side and L' side) of the main display area 02 respectively. In some other embodiments, the at least one bent portion 101 includes a single bent portion 101 which extends from a single side of the main display area (e.g., the L side or the L' side). Of course, for the flexible array substrate, regardless of the number of the at least one bent portion 101 provided in the non-display area 01, the plurality of signal connecting portions are provided on side(s) of the at least one bent portion 101 away from the main display area 02.

Due to limitations of the manufacturing process, it will be understood by those skilled in the art that the aforementioned "a pair of opposite sides of the main display area 02" refers to a pair of opposite sides of the main display area 02 arranged along a bendable direction (such as direction G-G' in FIG. 4) in the flexible array substrate.

Based on this, the arrangement of the plurality of gate connecting portions 122 and the plurality of data connecting portions 112 located in the connecting regions 102 will be further described below.

For example, the at least one bent portion 101 includes two bent portions 101, which extend from the pair of opposite sides of the main display area 02 (e.g., the L side and L' side in FIG. 3) respectively, and a side of each of the two bent portions 101 that is away from the main display area 02 is provided with multiple signal connecting portions.

Referring to FIGS. 3 and 4, in some embodiments, the plurality of gate connecting portions 122 and the plurality of data connecting portions 112 are respectively disposed in two connecting regions 102 located at a pair of opposite sides of the main display area 02. That is, the at least one GOA circuit electrically connected to the plurality of gate connecting portions 122 is located in a connecting region 102 which is located at one side of the pair of opposite sides of the main display area 02, and the at least one source driver IC electrically connected to the plurality of data connecting portions 112 is located in another connecting region 102 which is located at another side of the pair of opposite sides of the main display area 02. It will be understood herein that by arranging the at least one gate driving circuit (e.g., GOA circuit) and the at least one source driving circuit (e.g., source driver IC) in connecting regions 102 at different sides of the main display area 01, this design scheme avoids mutual interference between the at least one gate driving circuit and the at least one source driving circuit, and is more conducive to wiring design.

In some other embodiments, the above two connecting regions 102 are provided, and each of the two connecting regions 102 is provided with multiple gate connecting portions 122 and multiple data connecting portions 112 therein. For example, the at least one gate driving circuit includes a double-sided driven GOA circuit. The at least one source driver IC includes a plurality of source driver ICs, and the plurality of source driver ICs are disposed in the two connecting regions 102 respectively. In practical applications, arrangement manners of the at least one gate driving circuit and the at least one source driving circuit are selected according to actual needs.

For another example, the at least one bent portion 101 includes a single bent portion 101, which is disposed at one of the pair of opposite sides of the main display area 02 (e.g., the L side or L' side in FIG. 3), and the at least one connecting region 102 includes a single connecting region 102 which is disposed at a side of the bent portion 101 away from the main display area 02. In this case, the plurality of signal connecting portions such as the plurality of gate connecting portions 122 and the plurality of data connecting portions 112 are disposed in the connecting region 102.

Most display devices are substantially rectangular, and each rectangular display device has a pair of opposite long edges and a pair of opposite short edges, that is, the main display area of the display device have a pair of opposite long sides and a pair of short sides. Correspondingly, the flexible array substrate includes a pair of opposite long edges and a pair of opposite short edges. Based on this, in some embodiments, the at least one bent portion 101 is disposed on the long edges of the flexible array substrate, so that the flexible array substrate may be bent to the back side along the at least one bent portion 101 on the long edges. In this way, compared with a design of bending the short edges, a screen-to-body ratio of a display device formed by providing at least one bent portion 101 on the long edges is larger, and this design is more in line with the demand for display devices with a high (or ultra-high) screen-to-body ratio.

It will be understood that when it is only possible to realize bending in one direction in the manufacturing process, for the flexible array substrate in which the at least one bent portion 101 is provided on a pair of opposite long edges and that may be bent along the at least one bent portion 101, a pair of opposite short edges thereof is not provided with at least one bent portion 101 due to limitations of the manufacturing process.

Of course, it will be understood that, for a mobile terminal such as a mobile phone or a tablet computer, in some embodiments, the arrangement manner of respectively providing two bent portions 101 on a pair of opposite long edges described above is adopted, but embodiments of the present disclosure are not limited thereto. For example, for a television screen, a computer screen, etc., when in use, a pair of opposite short edges are a left edge and a right edge, and a pair of opposite long edges are an upper edge and a lower edge. In order to meet actual display requirements and enable viewers to get better visuals and a larger viewing angle, in some other embodiments, the two bent portions 101 and the signal connecting portions are provided on the pair of opposite short edges of the flexible array substrate.

In addition, in the flexible array substrate, the plurality of gate lines 12 and the plurality of data lines 11 in the main display area 02 are arranged to cross each other. Based on this, in some embodiments, an angle between the plurality of gate lines 12 and the plurality of data lines 11 is an acute angle. In some other embodiments, the plurality of gate lines 12 and the plurality of data lines 11 are disposed perpendicular to each other. In some embodiments, the plurality of gate lines 12 and the plurality of data lines 11 are disposed perpendicular to each other, the plurality of gate lines 12 are parallel to a pair of opposite sides of the flexible array substrate, and the plurality of data lines 11 are parallel to another pair of opposite sides of the flexible array substrate. For this design, in some embodiments, as shown in FIG. 3, the plurality of gate connecting portions 122 and the plurality of data connecting portions 112 are located at at least one of a pair of opposite sides of the main display area 02, and the plurality of gate lines 12 pass through the main display area 02 and extend to the at least one bent portion 101. In some other embodiments, the plurality of gate connecting portions 122 and the plurality of data connecting portions 112 are located at at least one of a pair of opposite sides of the main display area 02, and the plurality of data lines 11 pass through the main display area 02 and extend to the at least one bent portion 101.

A description is given below by taking an example in which the plurality of gate connecting portions 122 and the plurality of data connecting portions 112 are respectively located at the pair of opposite sides of the main display area 02, and the plurality of gate lines 12 pass through the main display area 02 and extend to the at least one bent portion 101. In this case, referring to FIGS. 3 and 4, each of the plurality of gate connecting portions 122 is located at an end of a corresponding one of the plurality of gate lines 12 (i.e., in the G-G' direction of FIG. 4). Referring to FIG. 3, the plurality of gate connecting portions 122 are connected to the plurality of gate lines 12 via a plurality of gate line leads 121 disposed at a same side as the plurality of gate connecting portions 122, which makes wiring relatively simple.

As shown in FIG. 3, each of the plurality of data connecting portions 112 is not disposed at an end of a corresponding one of the plurality of data lines 11, but is disposed at a side of the plurality of data lines 11 (That is, at ends of the plurality of gate lines 12). Based on this, as shown in FIG. 3, each of the plurality of data line leads 111 extends from an end of a corresponding one of the plurality of data lines 11 (i.e., the side not provided with the at least one bent portion 101) around the main display area 02 to the side where the plurality of data connecting portions 112 are located.

Figure 5:
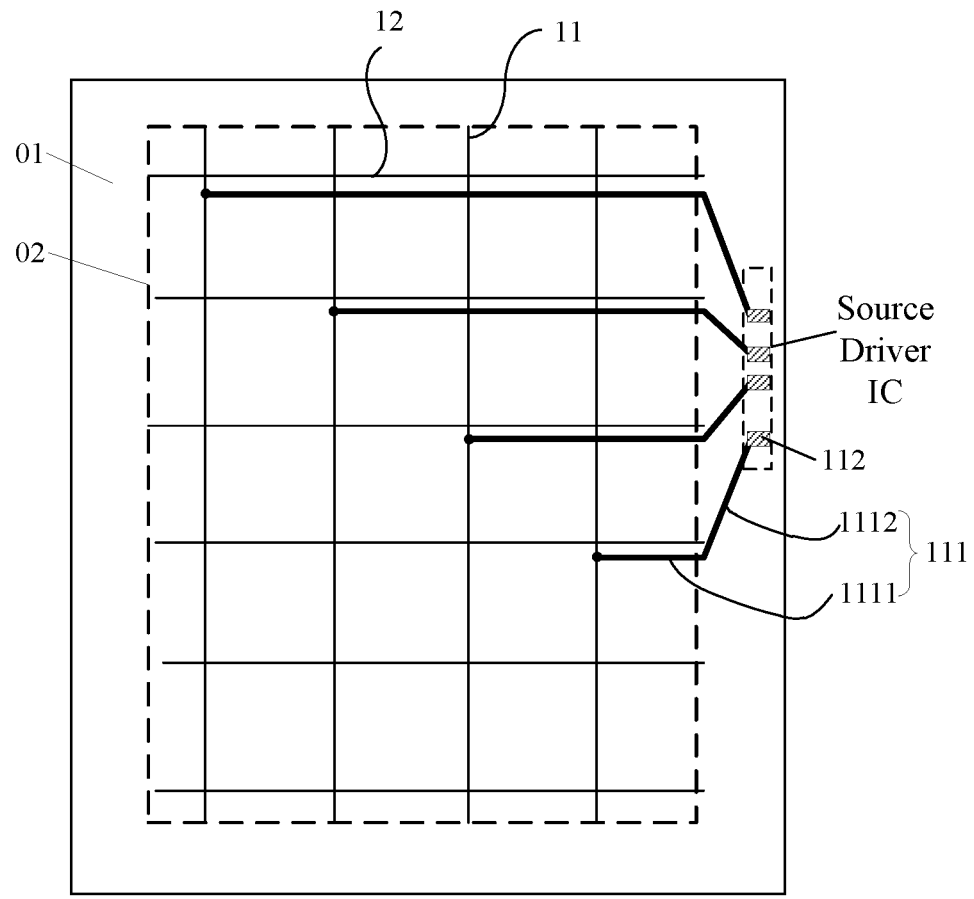
FIG. 5 is a schematic diagram showing a structure of yet another flexible array substrate according to some embodiments of the present disclosure.

In some other embodiments, as shown in FIG. 5, each of the plurality of data line leads 111 includes a lead body 1111 located in the main display area 02, and an edge lead 1112 located between the main display area 02 and the plurality of data connecting portions 112 (the side on which the edge lead 1112 is connected to the source driver IC in FIG. 5). In some other embodiments, each of the plurality of data line leads 111 includes a lead body 1111 located in the main display area 02, or an edge lead 1112 located between the main display area 02 and the plurality of data connecting portions 112. One end of the lead body 1111 is connected to a corresponding one of the plurality of data lines 11 in the main display area 02, and another end of the lead body is connected to a corresponding one of the plurality of data connecting portions 112 through the edge lead 1112.

Based on the above, since the lead body 1111 is located in the main display area 02, and the plurality of data connecting portions 112 and the edge lead 1112 are located in the non-display area 01 and are located at a same side of the main display area 02, the plurality of data lines 11 may be connected to the plurality of data connecting portions 112 by simple wiring. In this way, a narrow bezel design may be obtained.

Referring to FIG. 5, each of the plurality of data line leads 111 includes a lead body 1111 and an edge lead 1112 described above, and the lead body 1111 may intersect with at least one of the plurality of data lines 11. In order to avoid a short circuit, in some embodiments, the plurality of data lines 11 and a plurality of lead bodies 1111 included in the plurality of data line leads 111 are disposed in different layers, and each of the plurality of the lead bodies 1111 and a corresponding one of the plurality of data lines 11 are electrically connected by a via hole formed in an insulating layer between the plurality of lead bodies 1111 and the plurality of data lines 11.

In addition, as for the plurality of lead bodies 1111 shown in FIG. 5, in some embodiments, the plurality of gate lines 12 and the plurality of lead bodies 1111 are disposed in a same layer and are made of a same material, but are not electrically connected. In this way, the plurality of gate lines 12 and the plurality of lead bodies 1111 may be simultaneously formed by one patterning process, thereby simplifying the manufacturing process of the flexible array substrate and reducing the manufacturing cost.

Of course, FIG. 5 is only a schematic illustration by taking an example in which the plurality of gate lines 12 are parallel to the plurality of lead bodies 1111. In practice, actual wiring of the plurality of lead bodies 1111 in the main display area 02 is not specifically limited, as long as the plurality of data lines 11 can be connected to edge leads 1112 through the plurality of lead bodies 1111. In some embodiments, each lead body 1111 includes a lateral section and a longitudinal section that are connected to each other. The lateral section is disposed in a same layer and made of a same material as the plurality of gate lines 12, and the longitudinal section is disposed in a same layer and made of a same material as the plurality of data lines 11. In this case, the lateral section and the longitudinal section are disposed in different layers and connected to each other through, for example, a hole.

Further, when designing the wiring for the edge leads 1112, it is only necessary to ensure that each edge lead 1112 is not short-circuited with other lines (e.g., the plurality of gate line leads 121), and is capable of normal electrical transmission. The specific wiring method will not be described in detail here.

Figure 6:
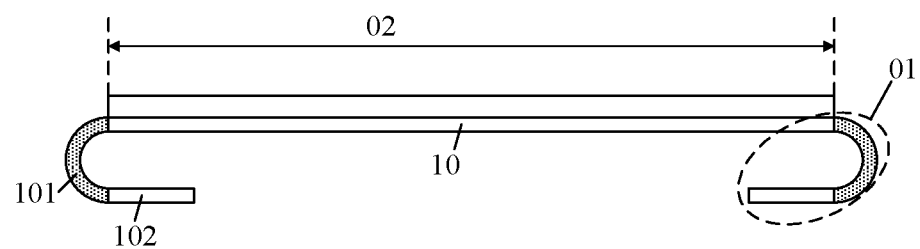
FIG. 6 is a schematic diagram showing a structure of yet another flexible array substrate according to some embodiments of the present disclosure.

In some embodiments, as shown in FIG. 6, the flexible array substrate in the flexible display device is bent along each of the at least one bent portion 101, so as to bend the plurality of signal connecting portions such as the plurality of data connecting portions 112 and the plurality of gate connecting portions 122 located at a side of the at least one bent portion 101 away from the main display area 02 to a back side of a portion of the flexible array substrate corresponding to the main display area 02. In this way, the at least one source driving circuit connected to the plurality of data connecting portions 112 and the at least one gate driving circuit connected to the plurality of gate connecting portions 122 may be moved to the back side of the main display area away from the first surface, thus realizing narrow bezel design of the entire display device.

Figure 7:
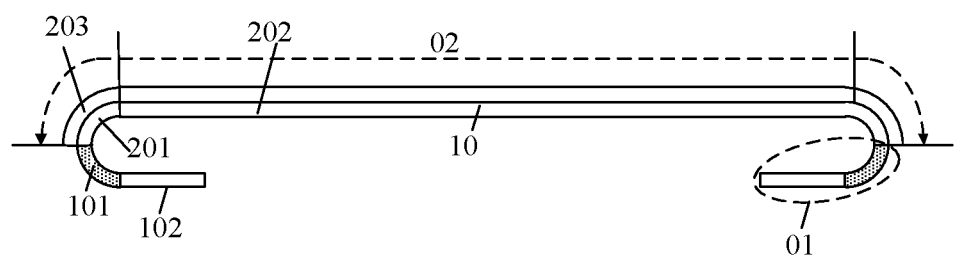
FIG. 7 is a schematic diagram showing a structure of yet another shift register according to some embodiments of the present disclosure.
Figure 8:
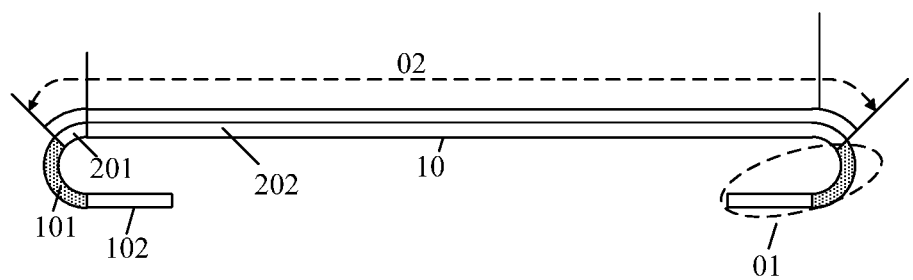
FIG. 8 is a schematic diagram showing a structure of yet another flexible array substrate according to some embodiments of the present disclosure.

In some other embodiments, as shown in FIGS. 7 and 8, a portion of the flexible substrate 10 within the main display area 02 includes a main portion 202 and at least one curved portion 201 each located between the main portion 202 and a corresponding one of the at least one bent portion 101. In some embodiments, the at least one curved portion 201 includes a single curved portion 201, which is provided at one side of the main portion 202. In some other embodiments, the at least one curved portion 201 includes two curved portion 201, which are respectively provided at two opposite sides of the main portion 202. In this case, the flexible display device is a curved screen display device, and the region where the main portion 202 is located is a main region for display. Each of the at least one curved portion 201 and an adjacent one of the at least one bent portion 101 are both curved, so that the plurality of data connecting portions 112 and the plurality of gate connecting portions 122 located in the at least one connecting region 102 may be bent to the back side of the portion of the flexible array substrate corresponding to the main portion 202. In this way, the at least one source driving circuit connected to the plurality of data connecting portions 112 and the at least one gate driving circuit connected to the plurality of gate connecting portions 122 may be moved to the back side of the main display area away from the first substrate, thus realizing narrow bezel design of the entire display device.

Of course, it will be understood that in the above arrangement manner in which each of the at least one curved portion 201 and the corresponding one of the at least one bent portion 101 are both curved, other portions of the flexible array substrate corresponding to the at least one curved portion 201 will also be bent. For example, as shown in FIG. 7, the portion 203 of the flexible array substrate is also bent.

In addition, regarding the aforementioned "back side" in the "back side of a portion of the flexible array substrate corresponding to the main portion 202", it will be understood by those skilled in the art that for whether a flexible array substrate or a flexible display device, the back side refers to a side on which no display is performed (that is, a non-display side), or a side opposite to a display side (or viewing side).

It will be noted that a manner of arranging the main portion 202 is not limited herein. In some embodiments, the main portion 202 is flat. In some other embodiments, the main portion 202 is not flat. For example, the main portion is curved. In a case where the main portion 202 is curved, a viewing angle of the display device is larger.

FIG. 6 shows an arrangement manner of bending the flexible array substrate by bending the at least one bent portion 101. However, in FIGS. 7 and 8, the flexible array substrate is bent by way of the at least one curved portion 201 and the at least one bent portion 101. In this design scheme, since the bent region includes a part of the main display area 02, the bezel on the edge provided with one of the at least one bent portion 101 is further narrowed, even close to zero. Thus, the screen-to-body ratio of the display device is further increased.

FIGS. 7 and 8 show an arrangement manner of bending the flexible array substrate by way of the at least one curved portion 201 and the at least one bent portion 101. Moreover, in order to narrow the bezel as much as possible, in some embodiments, the main portion 202 is flat, the at least one bent portion and the at least one curved portion are configured to be bent. A boundary away from the main portion 202 in boundaries of an orthographic projection of each of the at least one bent portion 101 on a plane parallel to the main portion 202 is a first boundary, and a boundary away from the main portion 202 in boundaries of an orthographic projection of a corresponding one of the at least one curved portion 201 on a plane parallel to the main portion 202 is a second boundary. The first boundary and the second boundary are located outside the main portion 202 and at a same side of the main portion 202.

In some embodiments, as shown in FIG. 8, the first boundary is away from the main display area relative to the second boundary. In some other embodiments, as shown in FIG. 7, the first boundary and the second boundary overlap substantially. In the design scheme in which the first boundary and the second boundary overlap substantially, the at least one curved portion 201 and the at least one bent portion 101 are both curved, and each of the at least one bent portion 101 that cannot be used for display may be hidden behind a corresponding curved portion 201 that can be used for display. It may be capable of minimizing the bezel on side(s) of the display device provided with the at least one bent portion 101, basically realizing a bezel-less effect. That is, while ensuring that the width of the bezel on a side not provided with the at least one bent portion 101 can be reduced, this design scheme may also minimize the width of the frame on side(s) provided with the at least one bent portion 101, thereby further improving the screen-to-body ratio of the display device.

Figure 9:
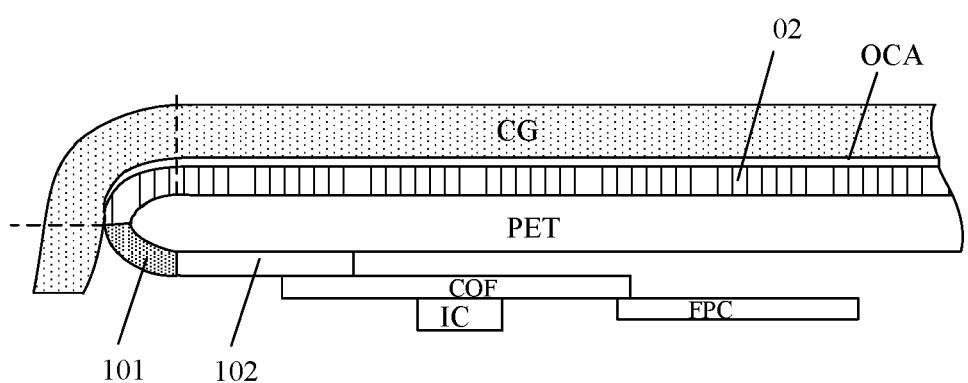
FIG. 9 is a schematic diagram showing a structure of a flexible display device according to of some embodiments of the present disclosure.

Some embodiments of the present disclosure provide a flexible display device. As shown in FIG. 9, the display device includes the flexible array substrate described above, and at least one driving circuit electrically connected to the plurality of signal connecting portions in the flexible array substrate.

In some embodiments, the plurality of signal connecting portions include a plurality of data connecting portions and/or a plurality of gate connecting portions, and the at least one driving circuit includes at least one source driving circuit and at least one gate driving circuit. The at least one source driving circuit is electrically connected to the plurality of data connecting portions, and/or the at least one gate driving circuit is electrically connected to the plurality of gate connecting portions.

In some embodiments, as shown in FIG. 4, the at least one gate driving circuit is at least one GOA circuit, and output end(s) of the at least one GOA circuit are electrically connected to the plurality of gate connecting portions.

In some embodiments, as shown in FIG. 9, the at least one source driving circuit is at least one source driver IC, which is electrically connected to the plurality of gate connecting portions via at least one COF.

In some embodiments, the display device is a liquid crystal display (LCD). In some other embodiments, the display device is an organic light-emitting diode (OLED) display device or a quantum dots electro-luminescence display (QLED) device. For an OLED display device or a QLED device, a light-emitting device is disposed in each of a plurality of sub-pixels defined by the plurality of gate lines 12 and the plurality of data lines 11. For example, an OLED light-emitting device is disposed in each sub-pixel of the OLED display device, and a QLED light-emitting device is disposed in each sub-pixel of the QLED device.

The display device provided by the embodiments of the present disclosure is, for example, an electronic paper, a display panel, a mobile phone, a tablet computer, a television, a display, a notebook computer, a digital photo frame, a navigator, or any other product or component having a display function.

Of course, arrangement manners and connection manners of the at least one source driving circuit and the at least one gate driving circuit in the display device have been described in detail in the foregoing embodiments, and will not be described herein again.

Figure 11:
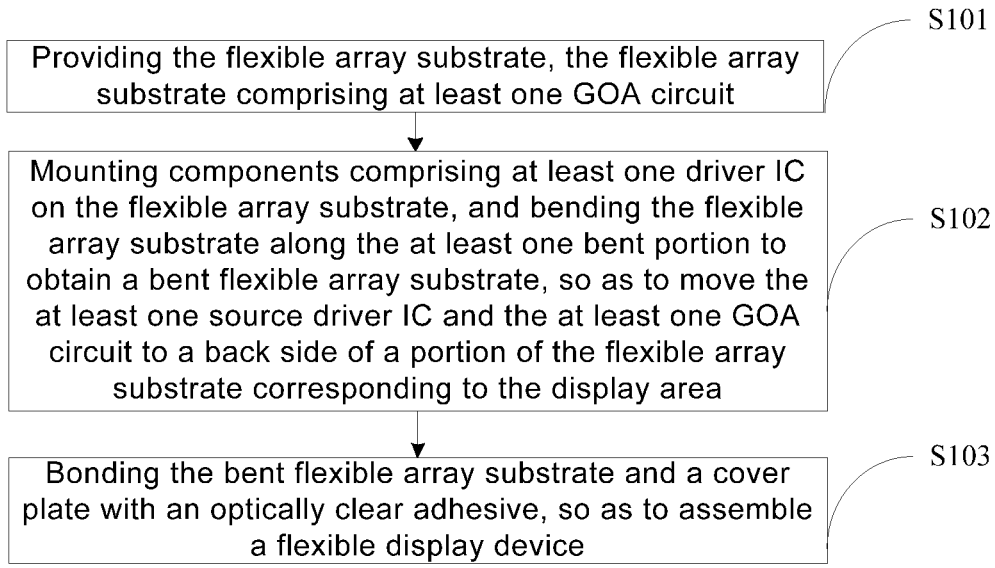
FIG. 11 is a schematic flow chart of a method of assembling a flexible display device according to some embodiments of the present disclosure.

Some embodiments of the present disclosure provide a method of assembling a flexible display device. The flexible display device is for example the flexible display device described above. As shown in FIG. 11, the method includes steps 101-103 (S101-S103).

In S101, the flexible array substrate described above is provided, and as shown in FIG. 4, the flexible array substrate includes at least one GOA circuit.

In S102, as shown in FIG. 9, components including at least one source driver IC is mounted on the flexible array substrate described above, and the flexible array substrate is bent along each of the at least one bent portion, so as to move each of the at least one source driver IC and each of the at least one GOA circuit on the flexible array substrate to a back side of a portion of the flexible array substrate corresponding to a main display area.

Figure 10:
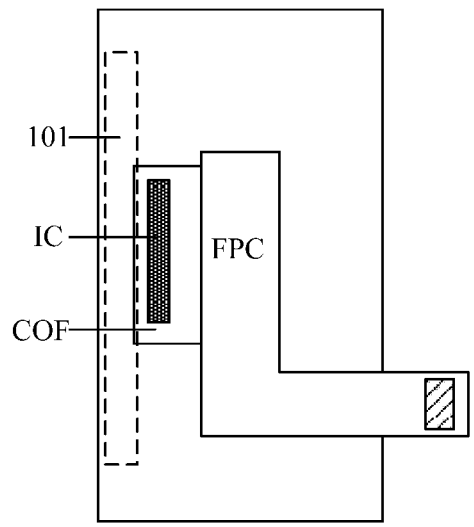
FIG. 10 is a schematic plan view showing a portion of a flexible array substrate in the flexible display device of FIG. 9 bent along a bent portion to a back side.

Referring to FIGS. 9 and 10 (FIG. 10 is a plan view showing a flexible array substrate bent along each of the at least one bent portion 101 to the back side), in some embodiments, components including the at least one source driver IC are mounted on the aforementioned flexible array substrate using at least one COF, but the present disclosure is not limited thereto. In some embodiments, the display device further includes at least one FPC (Flexible Printed Circuit) disposed on the flexible array substrate, and the at least one FPC is connected to the at least one COF. Correspondingly, the method further includes mounting at least one FPC on the flexible array substrate using the at least one COF.

In addition, in some embodiments, the flexible substrate 10 includes a main portion 202 and at least one curved portion 201 each located between the main portion 202 and a corresponding one of the at least one bent portion 101, and "bending the flexible array substrate along each of the at least one bent portion 101, so as to move each of the at least one source driver IC and each of the at least one GOA circuit on the flexible array substrate to a back side of a portion of the flexible array substrate corresponding to a main display area 02" in S102 is achieved by the following steps. Referring to FIG. 7, the flexible array substrate is bent along each of the at least one bent portion 101 by a pad bending technique, so that each of the at least one source driver IC and each of the at least one GOA circuit on the flexible array substrate are moved to the back side of the portion of the flexible array substrate corresponding to the main portion 202 by way of the at least one bent portion 101 and the at least one curved portion 201. In this way, the width of the bezel is further reduced.

Of course, after bending the flexible array substrate along each of the at least one bent portion 101, in order to provide support and fix the bent flexible array substrate, referring to FIG. 9, in some embodiments, the display device further include a support plate disposed on the back side of the portion of the flexible array substrate corresponding to the main display area 02 (e.g., through adhesive bonding). A material of the support plate is, for example, PET (polyethylene terephthalate). On the basis of this, in order to ensure stability of the bend and to avoid deformation due to compression in subsequent use, in some embodiments, one end of the support plate close to one of the at least one bent portion 101 contact the one of the at least one bent portion 101, so as to provide support for a curved surface at the bend.

In S103, the bent flexible array substrate and a cover plate, for example, a cover glass (CG) are bonded with optically clear adhesive (OCA), so as to assemble the flexible display device.

Referring to FIG. 9, in a case where the flexible array substrate is bent by way of the at least one bent portion 101 and the at least one curved portion 201, the cover glass is also curved at a position corresponding to the curved portion 201, and is in close contact with the curved portion 201 of the flexible array substrate.

In the actual assembly process, after the cover plate is assembled, the method of assembling the flexible display device further includes assembling components such as a middle casing and an outer casing. With respect to a touch display device, the method also includes assembling touch components. In actual production, an appropriate installation process may be selected according to actual needs, and details are not described here again.

Of course, regarding the related manufacturing processes of the flexible array substrate and the display device, the foregoing arrangement manners may be referred to, and an appropriate process may be selected for processing. The beneficial effects of related structures have been described in the foregoing embodiments, and details are not described herein again.

Hereinafter, the method of assembling the flexible display device will be described by taking the above display device being a mobile phone as an example. The at least one bent portion 101 includes two bent portions 101, which are disposed on left and right long edges of the mobile phone respectively. The at least one source driver IC is connected to the plurality of data connecting portions 112 disposed on a long edge of the mobile phone by at least one COF, and each of the at least one gate driving circuit is a GOA circuit disposed on another long edge of the mobile phone. In this case, the flexible array substrate is bent along each of the two bent portion 101 provided on the left and right long edges by a pad bending technique, so that the at least one source driver IC and the at least one GOA circuit are bent to the back side of the flexible display device. In this way, space is released at the bezel on the short edges as the at least one source driver IC and the at least one GOA on these edges are removed, and the width of the bezel of the mobile phone at the short edges is reduced. In the meantime, with a curved screen design, each of the at least one bent portion 101 may be hidden behind a corresponding curved portion 201. As a result, the width of the bezel on the left and right long edges may be minimized, thereby realizing a bezel-less effect on the left and right long edges.

The foregoing descriptions are merely some implementation manners of the present disclosure, but the protection scope of the present disclosure is not limited thereto. Any person skilled in the art could readily conceive of changes or replacements within the technical scope of the present disclosure, which shall all be included in the protection scope of the present disclosure. Therefore, the protection scope of the present disclosure shall be subject to the protection scope of the claims.

What is claimed is:

1. A flexible array substrate, having a main display area, the flexible array substrate comprising:
    a flexible substrate comprising at least one bent portion extending from at least one side of the main display area,
    a plurality of signal connecting portions disposed at a side of the at least one bent portion away from the main display area, the plurality of signal connecting portions comprising a plurality of data connecting portions and/or a plurality of gate connecting portions,
    a plurality of signal lines disposed on a first surface of the flexible substrate in the main display area and the plurality of signal connecting portions being configured to electrically connect the plurality of signal lines to at least one driving circuit, wherein the plurality of signal lines comprises a plurality of gate lines and a plurality of data lines crossing each other, and the at least one driving circuit includes at least one source driving circuit and at least one gate driving circuit, and
    a plurality of data line leads and/or a plurality of gate line leads disposed on the first surface of the flexible substrate, wherein
    the plurality of data connecting portions are configured to electrically connect the plurality of data lines to the at least one source driving circuit, and configured to be respectively electrically connected to the plurality of data lines through the plurality of data line leads; and/or the plurality of gate connecting portions are configured to electrically connect the plurality of gate lines to the at least one gate driving circuit, and configured to be respectively electrically connected to the plurality of gate lines through the plurality of gate line leads;
    the at least one bent portion is configured to bend toward a second surface of the flexible substrate opposite to the first surface to move the plurality of signal connecting portions to a back side of the main display area away from the first surface; and
    the main display area is polygonal in shape, the at least one bent portion includes two bent portions which respectively extend from a pair of opposite sides of the main display area, and the plurality of signal connecting portions are located on the pair of opposite sides of the main display area.

2. The flexible array substrate according to claim 1, wherein the plurality of gate lines pass through the main display area and extend to the at least one bent portion.

3. The flexible array substrate according to claim 2, wherein
    each of the plurality of data line leads comprises a lead body located in the main display area, and/or an edge lead located between the main display area and the plurality of data connecting portions;
    one end of the lead body is connected to a corresponding one of the plurality of data lines in the main display area, and another end of the lead body is connected to a corresponding one of the plurality of data connecting portions through the edge lead.

4. The flexible array substrate according to claim 1, wherein the main display area is rectangular in shape, and the main display area has a pair of opposite long sides and a pair of opposite short sides, and the flexible array substrate comprises a pair of opposite long edges and a pair of opposite short edges;
    the at least one bent portion is located on at least one of the pair of opposite long edges of the flexible array substrate, and the flexible array substrate is not provided with a bent portion on the pair of opposite short edges.

5. The flexible array substrate according to claim 1, wherein a portion of the flexible substrate within the main display area includes a main portion and at least one curved portion each located between the main portion and a corresponding one of the at least one bent portion.

6. The flexible array substrate according to claim 5, wherein the at least one bent portion and the at least one curved portion are configured to be bent;
    the main portion is flat;
    a boundary away from the main portion in boundaries of an orthographic projection of each of the at least one bent portion on a plane parallel to the main portion is a first boundary; a boundary away from the main portion in boundaries of an orthographic projection of a corresponding one of the at least one curved portion on a plane parallel to the main portion is a second boundary; the first boundary and the second boundary are located outside the main portion and located at a same side of the main portion;
    the first boundary and the second boundary overlap.

7. The flexible array substrate according to claim 1, wherein each of the at least one bent portion comprises at least one groove formed in the first surface and at least one filler each of which filled in a corresponding one of the at least one groove, a flexibility of the at least one filler is higher than a flexibility of the at least one bent portion.

8. A flexible display device, comprising:
    the flexible array substrate according to claim 1; and
    at least one driving circuit electrically connected to the plurality of signal connecting portions in the flexible array substrate.

9. The flexible display device according to claim 8, wherein the plurality of signal connecting portions comprise a plurality of data connecting portions and/or a plurality of gate connecting portions, and the at least one driving circuit includes at least one source driving circuit and at least one gate driving circuit;

the at least one source driving circuit is electrically connected to the plurality of data connecting portions in the flexible array substrate; and/or the at least one gate driving circuit is electrically connected to the plurality of gate connecting portions in the flexible array substrate.

10. The flexible array substrate according to claim 9, wherein the at least one gate driving circuit is at least one GOA circuit; and output end(s) of the at least one GOA circuit are electrically connected to the plurality of gate connecting portions.

11. The flexible display device according to claim 9, wherein the at least one source driving circuit is at least one source driver IC, and the at least one source driver IC and the plurality of data connecting portions are connected by at least one COF.

12. A method of assembling a flexible display device, comprising:

providing the flexible array substrate comprising:

a flexible substrate comprising at least one bent portion extending from at least one side of the main display area, a plurality of signal connecting portions disposed at a side of the at least one bent portion away from the main display area, the plurality of signal connecting portions comprising a plurality of data connecting portions and/or a plurality of gate connecting portions, a plurality of signal lines disposed on a first surface of the flexible substrate in the main display area and the plurality of signal connecting portions being configured to electrically connect the plurality of signal lines to at least one driving circuit, wherein the plurality of signal lines comprises a plurality of gate lines and a plurality of data lines crossing each other, and the at least one driving circuit includes at least one source driving circuit and at least one gate driving circuit, and a plurality of data line leads and/or a plurality of gate line leads disposed on the first surface of the flexible substrate, wherein the plurality of data connecting portions are configured to electrically connect the plurality of data lines to the at least one source driving circuit, and configured to be respectively electrically connected to the plurality of data lines through the plurality of data line leads; and/or the plurality of gate connecting portions are configured to electrically connect the plurality of gate lines to the at least one gate driving circuit, and configured to be respectively electrically connected to the plurality of gate lines through the plurality of gate line leads;

the at least one bent portion is configured to bend toward a second surface of the flexible substrate opposite to the first surface to move the plurality of signal connecting portions to a back side of the main display area away from the first surface; and the main display area is polygonal in shape, the at least one bent portion includes two bent portions which respectively extend from a pair of opposite sides of the main display area, and the plurality of signal connecting portions are located on the pair of opposite sides of the main display area, the flexible array substrate comprising at least one GOA circuit;

mounting components comprising at least one driver IC on the flexible array substrate, and bending the flexible array substrate along the at least one bent portion to obtain a bent flexible array substrate, so as to move the at least one source driver IC and the at least one GOA circuit to a back side of a portion of the flexible array substrate corresponding to the main display area; and bonding the bent flexible array substrate and a cover plate with an optically clear adhesive, so as to assemble a flexible display device.

13. The method of assembling the flexible display device according to claim 12, wherein a portion of the flexible substrate within the main display area includes a main portion and at least one curved portion each located between the main portion and a corresponding one of the at least one bent portion, and bending the flexible array substrate along each of the at least one bent portion to obtain a bent flexible array substrate, so as to move the at least one source driver IC and the at least one GOA circuit to a back side of a portion of the flexible array substrate corresponding to a main display area, comprises:

bending the flexible array substrate along the at least one bent portion to obtain a bent flexible array substrate, so as to move the at least one source driver IC and the at least one GOA circuit on the flexible array substrate to a back side of a portion of the flexible array substrate corresponding to the main portion by way of the at least one curved portion and the at least one bent portion.

* * * * *